US006901549B2

(12) United States Patent
March et al.

(10) Patent No.: US 6,901,549 B2
(45) Date of Patent: May 31, 2005

(54) METHOD FOR ALTERING A WORD STORED IN A WRITE-ONCE MEMORY DEVICE

(75) Inventors: Roger W. March, Santa Clara, CA (US); Christopher S. Moore, San Jose, CA (US); Mark G. Johnson, Los Altos, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 534 days.

(21) Appl. No.: 10/023,200

(22) Filed: Dec. 14, 2001

(65) Prior Publication Data

US 2003/0115535 A1 Jun. 19, 2003

(51) Int. Cl.[7] .............................................. H03M 13/00
(52) U.S. Cl. ........................ 714/758; 714/752; 714/785
(58) Field of Search ................................. 714/758, 752, 714/785; 707/205

(56) References Cited

U.S. PATENT DOCUMENTS

| 4,646,266 A | 2/1987 | Ovshinsky et al. |
| 5,313,425 A | 5/1994 | Lee et al. |
| 5,432,729 A | 7/1995 | Carson et al. |
| 5,469,450 A | 11/1995 | Cho et al. |
| 5,563,947 A | 10/1996 | Kikinis |
| 5,596,639 A | 1/1997 | Kikinis |
| 5,708,667 A | 1/1998 | Hayashi |
| 5,784,391 A | 7/1998 | Konigsburg |
| 5,796,694 A | 8/1998 | Shirane |
| 5,835,396 A | 11/1998 | Zhang |
| 5,835,509 A | 11/1998 | Sako et al. |
| 5,872,790 A | 2/1999 | Dixon |
| 5,943,254 A | 8/1999 | Bakeman, Jr. et al. |
| 6,016,269 A | 1/2000 | Peterson et al. |
| 6,034,882 A | 3/2000 | Johnson et al. |
| 6,185,122 B1 | 2/2001 | Johnson et al. |
| 6,216,247 B1 | 4/2001 | Creta et al. |
| 6,236,587 B1 | 5/2001 | Gudesen et al. |
| 6,678,860 B1 * | 1/2004 | Lee ............................ 714/763 |
| 6,745,363 B2 * | 6/2004 | Poirier et al. ............... 714/763 |

FOREIGN PATENT DOCUMENTS

WO        WO 99/14763        3/1999

OTHER PUBLICATIONS

"Computer Engineering: Hardware Design," M. Morris Mano, Chapter 6–4 Error Detection and Correction, pp. 199–202 (1988).
"Reed–Solomon Codes," http://www.4i2i.com/reed_solomon_codes.htm. 8 pages (1998).
"The Norton Desktop (Version 3 For Windows) User's Guide," pp. 16–1 –16–6 (1993).
"Exotic Memories, Diverse Approaches," EDN Asia, pp. 22–33 (Sep. 2001).

(Continued)

*Primary Examiner*—Phung My Chung
(74) *Attorney, Agent, or Firm*—Brinks Hofer Gilson & Lione

(57) ABSTRACT

The preferred embodiments described herein provide a method for altering a word stored in a write-once memory device. In one preferred embodiment, a write-once memory device is provided storing a word comprising a plurality of data bits and a plurality of syndrome bits. The word is altered by identifying X bit(s) in the word that are in an un-programmed state and switching the X bit(s) from the un-programmed state to a programmed state, where X is sufficient to introduce an uncorrectable error in the word. Other preferred embodiments are provided, and each of the preferred embodiments can be used alone or in combination with one another.

21 Claims, 2 Drawing Sheets

OTHER PUBLICATIONS

"A Vertical Leap for Microchips," Thomas H. Lee, Scientific American, 8 pages (Jan. 2002; printed Dec. 10, 2001).

"Three–Dimensional Memory Array and Method of Fabrication," U.S. Appl. No. 09/560,626, filed Apr. 28, 2000; inventor: Johan Knall.

"Write–Once Memory Array Controller, System, and Method," U.S. Appl. No. 09/638,427, filed Aug. 14, 2000; inventorss: Derek J. Bosch, Christopher S. Moore, Daniel C. Steere, and J. James Tringali.

"Low–Cost Three–Dimensional Memory Array," U.S. Pat. No. 09/638,428, filed Aug. 14, 2000; inventors: Mark G. Johnson, Thomas H. Lee, Vivek Subramanian, and P. Michael Farmwald.

"Modular Memory Device," U.S. Appl. No. 09/638,334, filed Aug. 14, 2000; inventors: J. James Tringali, P. Michael Farmwald, Thomas H. Lee, Mark G. Johnson, and Derek J. Bosch.

"Memory Devices and Methods for Use Therewith," U.S. Appl. No. 09/748,589, filed Dec. 22, 2000; inventors: Roger W. March, Christopher S. Moore, Daniel Brown, Thomas H. Lee, and Mark G. Johnson.

"Three–Dimensional Memory Array and Method for Storing Data Bits and ECC Bits Therein," U.S. Appl. No. 09/747,574, filed Dec. 22, 2000; inventors: Thomas H. Lee, James M. Cleeves, and Mark G. Johnson.

"Method for Deleting Stored Digital Data from Write–Once Memory Device," U.S. Appl. No. 09/638,439, filed Aug. 14, 2000; inventors: Christopher S. Moore, Derek J. Bosch, Daniel C. Steere, and L. James Tringali.

"Solid–State Memory Device Storing Program Code and Methods for Use Therewith," U.S. Appl. No. 09/775,745, filed Feb. 2, 2001; inventors: Christopher S. Moore, Roger March, Dan Brown.

* cited by examiner

| BIT 7 DATA | BIT 6 DATA | BIT 5 DATA | BIT 4 DATA | BIT 3 $P_{7,6,5}$ | BIT 2 $P_{7,6,4}$ | BIT 1 $P_{7,5,4}$ |

*Fig. 1*

| 1 | 1 | 0 | 1 | 0 | 1 | 0 |

*Fig. 3*

| 0 | 1 | 0 | 0 | 0 | 1 | 0 |

*Fig. 4*

| 0 | 1 | 1 | 0 | 0 | 1 | 1 |

*Fig. 5*

| 0 | 1 | 0 | 0 | 0 | 1 | 0 |

*Fig. 6*

| 0 | 1 | 1 | 1 | 0 | 0 | 0 |

*Fig. 8*

| 0 | 1 | 0 | 1 | 0 | 0 | 0 |

*Fig. 9*

METHOD FOR ALTERING A WORD STORED IN A WRITE-ONCE MEMORY DEVICE

BACKGROUND

Non-volatile memory is becoming standard in many products such as digital cameras and digital audio players, and write-once memory devices offer the advantage of low manufacturing costs. Despite its advantages, a write-once memory device cannot be erased since the original, un-programmed state of a memory location cannot be restored once the memory location is switched to the programmed state. However, a user may wish to delete sensitive data, such as financial information, from a write-once memory device. Further, some upcoming copy protection standards, such as Secure Digital Media Interface, require memory contents to be erased.

There is a need, therefore, for a method for altering a word stored in a write-once memory device.

SUMMARY

The present invention is defined by the following claims, and nothing in this section should be taken as a limitation on those claims.

By way of introduction, the preferred embodiments described below provide a method for altering a word stored in a write-once memory device. In one preferred embodiment, a write-once memory device is provided storing a word comprising a plurality of data bits and a plurality of syndrome bits. The word is altered by identifying X bit(s) in the word that are in an un-programmed state and switching the X bit(s) from the un-programmed state to a programmed state, where X is sufficient to introduce an uncorrectable error in the word. Other preferred embodiments are provided, and each of the preferred embodiments can be used alone or in combination with one another.

The preferred embodiments will now be described with reference to the attached drawings.

BRIEF DESCRIPTION OF THE DRAWINGS

FIG. 1 is an illustration of a bit layout of a preferred embodiment.

FIG. 3 is an illustration of a word stored in a write-once memory device of a preferred embodiment.

FIG. 4 is an illustration of the word of FIG. 3 with bits 4 and 7 switched from an un-programmed state to a programmed state.

FIG. 5 is an illustration of a new word created to switch bits 4 and 7 from an unprogrammed state to a programmed state.

FIG. 6 is an illustration of the word of FIG. 3 overwritten with the new word of FIG. 5.

FIG. 8 is an illustration of a word created to switch bit 7 from an unprogrammed state to a programmed state.

FIG. 9 is an illustration of the word of FIG. 3 overwritten with the word of FIG. 8.

DETAILED DESCRIPTION OF THE PRESENTLY PREFERRED EMBODIMENTS

Figure 2:
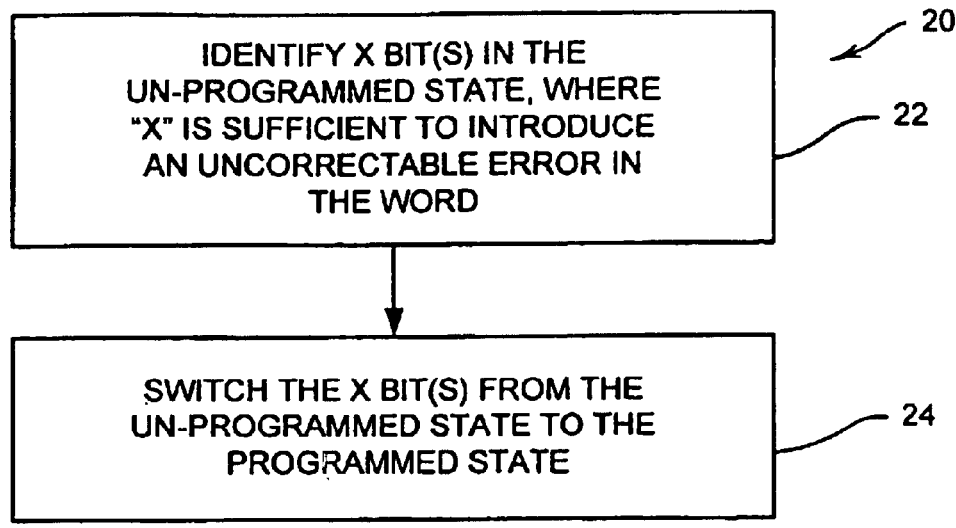
FIG. 2 is a flowchart of a method of a preferred embodiment for altering a word stored in a write-once memory device.

The preferred embodiments described below relate to write-once memory devices. In a write-once memory device, an original, un-programmed state of a memory location (i.e., a "bit") cannot be restored once switched to a programmed state. In a two-state system, the un-programmed state is Logic 1 (or Logic 0), and the programmed state is Logic 0 (or Logic 1). In a multi-state system, there is one un-programmed state (e.g., Logic 0), and multiple programmed states (e.g., Logic 1, Logic 2, etc.). For purposes of illustrating these preferred embodiments, the un-programmed state is Logic 1, and the programmed state is Logic 0. Preferably, the write-once memory device is field-programmable to allow a bit that is fabricated in an un-programmed state to be switched to a programmed state at a time after fabrication of the memory device.

Because the un-programmed state of a bit cannot be restored once it is switched to the programmed state, data stored in a write-once memory device cannot be erased. U.S. patent application Ser. No. 09/638,439, which is assigned to the assignee of the present invention and is hereby incorporated by reference, presents a method for making stored data difficult or impossible to read by overwriting the data with a destructive pattern. For example, each bit of data (e.g., 11010110) can be overwritten with a pattern of 0s, thereby placing each bit in the programmed state (e.g., 00000000). While programming all bits in an area to be deleted completely obliterates the data in that area, this approach can cause performance degradation of the memory device since performance properties such as speed and power degrade as the number of programmed bits increases. In another approach, an extra bit can be associated with a data string, and this extra bit is programmed when a command is received to delete the data string. When a host device attempts to read the data stream, the memory device or the host device determines whether the extra bit is in the programmed or un-programmed state. If the extra bit is in the un-programmed state, the data string is read from the memory device. If the extra bit is in the programmed state, the data string is considered deleted and will not be read from the memory device. While this approach avoids the performance degradation described above, it requires adding extra bits and control logic, which may not be possible in some memory devices.

The preferred embodiments presented herein provide a technique to delete data in a write-once memory device while avoiding the performance degradation and memory design modifications associated with the approaches discussed above. Some of these preferred embodiments take advantage of error protection schemes to alter bits stored in the write-once memory device. As used herein, the term "error protection scheme" refers to any technique that uses a plurality of syndrome bits and a plurality of data bits to detect and/or correct certain types of errors in the word containing the plurality of data and syndrome bits. Suitable error protection schemes include, but are not limited to, error correcting code (ECC), Reed-Solomon, BCH, Golay, and Viterbi. The preferred embodiments will be described with reference to an ECC scheme using a Hamming (k, n) code. With the Hamming (k, n) code, (k-n) syndrome bits are used to identify and correct a single-bit error in a word of k bits. The presence of two or more errors in the k-bit word cannot be corrected. While it is preferred that a Hamming (72, 64) code scheme be implemented, for simplicity, a Hamming (7, 4) code scheme will be used to illustrate these preferred embodiments with the bit layout depicted in FIG. 1. The seven-bit word in FIG. 1 contains four data bits (bits 4–7) and three syndrome bits (bits 1–3). The first syndrome bit (bit 1) is the parity of data bits 4, 5, and 7; the second syndrome bit (bit 2) is the parity of data bits 4, 6, and 7; and the third syndrome bit (bit 3) is the parity of data bits 5, 6, and 7. While the syndrome bits are located adjacent the data bits in FIG. 1, the syndrome bits can be dispersed within the word or located in a different part of the memory device. It is preferred that data and syndrome bits be distributed in the write-once memory device using the technique described in "Memory Device and Method for Storing Bits in Non-Adjacent Storage Locations in a Memory Array," U.S. patent application Ser. No. 10/024,647, (filed on the same day as the present application), which is hereby incorporated by reference.

In one preferred embodiment, data is "deleted" by altering enough data bits and/or syndrome bits to introduce an error in the word that is uncorrectable using the error protection scheme. Such an uncorrectable error exceeds the protection limit of the error protection scheme. For example, a Hamming code scheme can correct a single-bit error. However, if at least two bits (data bits and/or syndrome bits, if the memory design allows access to the syndrome bits) are altered, the Hamming code will not be able to correct the alteration made to the word. Additionally, with some words, an uncorrectable bit error will cause the error protection scheme to further scramble the data bits when it attempts to correct the uncorrectable error. As a result, the data bits read from the memory device will be different from the data bits originally stored in the memory device. Although the bits of a digital file cannot be restored to their original, un-programmed state, the bits can be sufficiently changed so that they no longer represent their original content. Accordingly, these preferred embodiments can be used in response to a command from a user or from a host device to delete a digital file. As used herein, an action is performed "in response to" an event when that action is performed immediately after the event or at some time after the event. When a stored digital file is deleted, one or more words associated with that digital file are altered. As also used herein, a word is associated with a stored digital file when it contains data that is part of the file itself. For example, if an uncorrectable error is introduced into a word containing audio data, "gaps" in the audio may be heard when the data is played back. This alteration of the audio data may be considered sufficient to "delete" the file. A word is also associated with a stored digital file when it contains data that is part of a file system structure. Consider, for example, the situation in which the word contains data for a pointer in a file allocation table that identifies the physical address of memory cells of a particular file. By altering the pointer, a file system of a host device would not be able to locate and retrieve the file, rendering the file inaccessible to a user. In addition to deleting data, these preferred embodiments can be used more generally to alter a word stored in a write-once memory device.

Turning again to the drawings, FIG. 2 is a flow chart 20 of a method of altering a word stored in a write-once memory device and will be discussed in conjunction with the illustrations of FIGS. 3–6. Because a bit in the programmed state cannot be restored to the un-programmed state in a write once memory device, only un-programmed bits can be altered (by switching the bit from the un-programmed state to the programmed state). Accordingly, the first act in this method is to identify X bit(s) in a word that are in an unprogrammed state, where "X" is sufficient to introduce an uncorrectable error in the word (act 22). For example, with the Hamming code, altering two or more bits is sufficient to introduce an uncorrectable error in the word. Accordingly, X=2 or more. In the word depicted in FIG. 3, bits 2, 4, 6, and 7 are in the un-programmed state. For this example, assume X is chosen to be the smallest possible number (here, 2), and bits 4 and 7 are identified as being in the un-programmed state.

With reference again to FIG. 2, the next act in this method is to switch the X bit(s) from the un-programmed state to the programmed state (act 24). If individual bits in a word can be switched without overwriting the word with a replacement word, this act can simply entail programming the bits that are to be switched. For example, as shown in FIG. 4, bits 4 and 7 can be programmed without regard to the other bits in the word. Because two bits in the word were altered, the Hamming code protecting this word will not be able to correct the alteration made to the word. Some memory devices do not allow programming on the bit level but instead require programming on the word level. With these memory devices, to switch a bit from the un-programmed state to the programmed state, a word containing that bit must be overwritten with a new word. For example, to switch bits 4 and 7 in the word shown in FIG. 3, a new word is generated, where the data bits in the word are "0" in bits 4 and 7 and "1" in the remaining bits. New syndrome bits are generated based on those new data bits. The new word is depicted in FIG. 5. The stored word (shown in FIG. 3) is then overwritten with the new word. Because the memory device is write-once, the result of the overwrite operation is the logical "and" of the two words. The result of the overwrite is shown in FIG. 6. As seen by a comparison of FIGS. 6 and 3, the altered data bits (0100) are different from the originally-stored data bits (1101).

It should be noted that the acts of identifying X bit(s) that are in the unprogrammed state and switching the X bit(s) from the un-programmed state to the programmed state cover the situation in which more than X bit(s) are identified in the unprogrammed state and only X bit(s) are switched to the programmed state. For example, in FIG. 3, four bits (bits 2, 4, 6, and 7) can be identified as being in the un-programmed state, and only two of those bits (bits 4 and 7) can be switched to the programmed state. Two bits (X bits) were still identified and switched even though two additional bits were identified but not switched.

Figure 7:
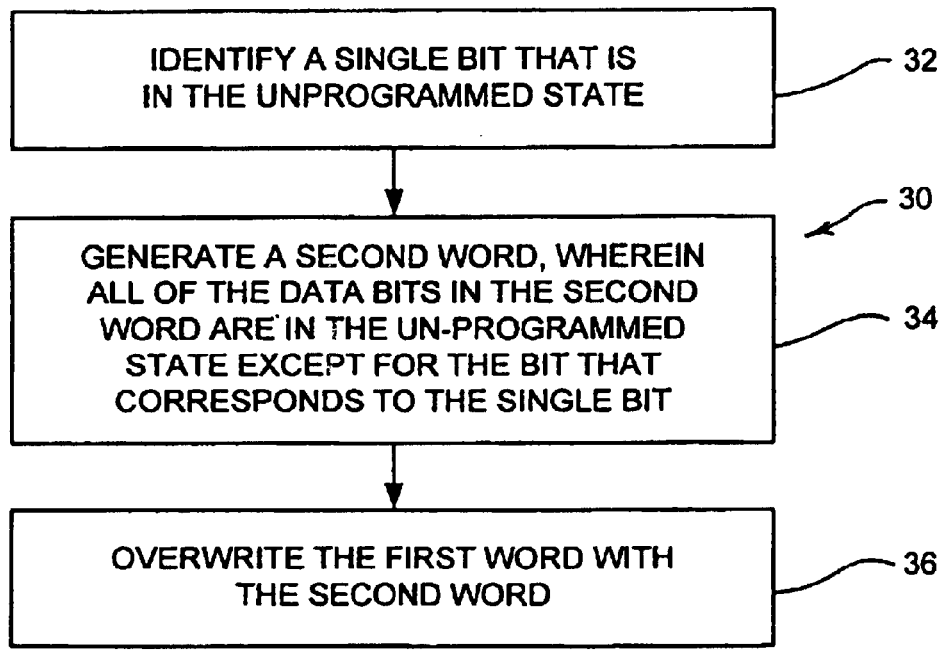
FIG. 7 is a flowchart of a method of a preferred embodiment for altering a word stored in a write-once memory device.

As discussed above, with the Hamming code, altering two bits (X=2) is sufficient to introduce an uncorrectable error in a word. However, it is highly likely that programming a single data bit will cause a change to one or more of the syndrome bits of a word. Accordingly, identifying and switching a single bit (X=1) can also result in a double-bit error. Since it is faster to find a single bit in the un-programmed state than it is to find two bits in the un-programmed state, this approach takes less time to implement than the approach discussed above. This method will now be discussed in conjunction with the flow chart 30 of FIG. 7. First, a single un-programmed bit in the plurality of data bits of the word is identified (act 32). With reference to FIG. 3, in this example, bit 7 is identified as being in the un-programmed state. Next, a second word is generated comprising a second plurality of data bits and a second plurality of syndrome bits (act 34). In the second word, all of the second plurality of data bits are in the un-programmed state except for a bit that corresponds to the single bit. With reference to FIG. 8, bits 4–6 are in the un-programmed state, and bit 7 (which corresponds to the single bit identified as being in the un-programmed state) is in the programmed state. As shown in FIG. 8, new syndrome bits (000) are generated for the data bits (0111). Finally, the first word stored in the write-once memory device is overwritten with the second word (act 36). As discussed above, with a write-once memory device, the result of the overwrite operation is the logical "and" of the first and second words. The result of the overwrite is shown in FIG. 9.

As seen by comparing the original word shown in FIG. 3 (11010100) with the result of the overwrite shown in FIG. 9 (0101000), identifying and switching a single bit (bit 7) results in a double-bit error (bits 7 and 2). When the word is read from the memory device, the ECC mechanism will detect that syndrome bits 1 and 3 are incorrect. Based on this detection, the ECC mechanism will assume that a single-bit error occurred at bit 5 and will attempt to correct the error by switching the value of bit 5, thereby further scrambling the original data bits. Accordingly, the data bits originally stored as 1101 are read as 0111. As shown by this example, taking advantage of an error protection scheme to cause "ECC hashing" is an inexpensive programming trick that can be used to provide good "data scrubbing" and without modifying the memory design and without incurring the full degradation associated with programming all bits to obliterate data (i.e., at less cost to device performance than a full write). Additionally, since less power is required to read an un-programmed bit than a programmed bit, this preferred embodiment offers increased power savings on read as compared to the approach that completely obliterates a word with programmed bits It is possible that programming a single data bit will not cause a change to one or more of the syndrome bits of the word and, thus, not produce an uncorrectable error. In an alternate embodiment, it is first determined whether switching a single bit to the programmed state will create an uncorrectable error. If switching the single bit will create an uncorrectable error, the approach discussed above is implemented. If switching a single bit will not create an uncorrectable error, two (or more) un-programmed bits are identified and switched to the programmed state.

The write-once memory device can take any suitable form, such as a solid-state memory device (i.e., a memory device that responds to electrical read and write signals to cause digital information to be read from and stored in a memory array of the device), a magnetic storage device (such as a hard drive), or an optical storage device (such as a CD or DVD). In one preferred embodiment, the write-once memory device takes the form of a solid-state memory device having a three-dimensional array, as described in U.S. Pat. No. 6,034,882 to Johnson et al., U.S. Pat. No. 5,835,396 to Zhang, and U.S. patent application Ser. No. 09/560,626, all of which are hereby incorporated by reference. As discussed in those documents, three-dimensional memory arrays provide important economies in terms of reduced size and associated reductions in manufacturing cost. Whether two- or three-dimensional, the memory array preferably comprises non-volatile passive element memory cells. Although any suitable type of memory cell can be used, in one preferred embodiment, the memory cell comprises an anti-fuse and a diode. It is important to note that the following claims should not be read as requiring a specific type of write-once memory device (e.g., solid-state or optical) or specific type of memory array (e.g., two dimensional or three-dimensional) unless explicitly recited therein.

In one preferred embodiment, the write-once memory device takes the form of a modular, compact, handheld unit, such as a memory card or stick, that comprises an external electrical connector that can be coupled with a host device, such as a digital camera, digital audio player, or other portable consumer product. As used herein, the terms "coupled with" and "connected to" are intended broadly to cover elements that are coupled with or connected to one another either directly or indirectly through one or more intervening components. The error protection scheme can be implemented as a hardware and/or software component in the write-once memory device. For example, the write-once memory device can comprise a hardware component that generates syndrome bits from data bits received from the host device and corrects errors in words read from the memory array. Alternatively, the error protection scheme can be implemented as a hardware and/or software component in the host device. For example, the file system in the host device can be responsible for generating the syndrome bits and for correcting errors in words read from the write-once memory device. Additionally, the functionality of the error protection scheme can be distributed between the write-once memory device and the host device.

Although a hardware implementation can be used (e.g., logic on an integrated circuit), it is preferred that the embodiments described above be implemented in software due to the shorter time needed to implement, debug, and upgrade a software system as compared to a hardware implementation. It is preferred that the software used be small and fast. Appendix 1 contains a C-program listing that can be used to find an un-programmed bit within a machine's native word size in O(log(N)) time. While the example is for a 32-bit machine, the number of entries in the partition array and iterations in the search loop can be changed for different word sizes.

It is intended that the foregoing detailed description be understood as an illustration of selected forms that the invention can take and not as a definition of the invention. It is only the following claims, including all equivalents, that are intended to define the scope of this invention. Finally, it should be noted that any aspect of any of the preferred embodiments described herein can be used alone or in combination with one another.

```
/*
 * Find an un-programmed bit, '1', in the passed word. In this example
 * the machine's native word is 32 bits. The return value is a new
 * value which when written to memory will cause ECC scrambling.
 */
unsigned long FindBit(unsigned long word)
{
    unsigned mask;
    unsiged i;
    /*
     * The partition array is used to locate where '1' in a field
     * that shrinks by 2 for each iteration.
     */
    static unsigned long partition [ ] = {
        0xffff0000        /* upper 16 bits of field */
        0xff00ff00,       /* upper 8 bits of field */
        0xf0f0f0f0,       /* upper 4 bits of field */
        0xcccccccc,       /* upper 2 bits of field */
        0xaaaaaaaa        /* upper 1 bits of field */
    };
    /*
     * It takes log2(32) = = 5 iterations to form a mask identifying
     * where a '1' exists.
     */
    mask = word;
    for (i =0; i != 5; + +i)
        if (mask & partition[i])
            (mask &= partition[i])
        else
            (mask &= ~partition[i])
    /*
     * Form and return the program value to cause scrambling.
     */
    work &= ~mask;
```

```
-continued return (word):
}
```

What is claimed is:

1. A method for altering a word stored in a write-once memory device, the method comprising:
   (a) providing a write-once memory device storing a word comprising a plurality of data bits and a plurality of syndrome bits;
   (b) identifying X bit(s) in the word that are in an un-programmed state; and
   (c) switching said X bit(s) in the word from the un-programmed state to a programmed state, wherein X is sufficient to introduce an uncorrectable error in the word.

2. The invention of claim 1 further comprising:
   (d) attempting to correct the uncorrectable error in the word using an error protection scheme.

3. The invention of claim 2, wherein the error protection scheme comprises error correcting code (ECC).

4. The invention of claim 2, wherein the error protection scheme is implemented in the write-once memory device.

5. The invention of claim 2, wherein the write-once memory device is coupled with a host device, and wherein the error protection scheme is implemented in the host device.

6. The invention of claim 1, wherein at least some of said X bit(s) are in the plurality of data bits.

7. The invention of claim 1, wherein at least some of said X bit(s) are in the plurality of syndrome bits.

8. The invention of claim 1, wherein said X bit(s) are switched from the unprogrammed state to the programmed state by overwriting the word with a second word.

9. The invention of claim 1, wherein the word is associated with a digital file stored in the write-once memory device, and wherein (b) and (c) are performed in response to a command to delete the digital file.

10. The invention of claim 1, wherein X=1.

11. The invention of claim 1, wherein X=2.

12. The invention of claim 1, wherein the write-once memory device comprises a three-dimensional memory array.

13. A method for altering a word stored in a write-once memory device, the method comprising:
   (a) providing a write-once memory device storing a first word comprising a first plurality of data bits and a first plurality of syndrome bits;
   (b) identifying a single bit in the first plurality of data bits that is in an unprogrammed state;
   (c) generating a second word comprising a second plurality of data bits and a second plurality of syndrome bits based on the second plurality of data bits, wherein all of the second plurality of data bits are in the un-programmed state except for a bit that corresponds to the single bit; and
   (d) overwriting the first word with the second word.

14. The invention of claim 13, wherein a word resulting from the overwriting comprises an uncorrectable error, and wherein the invention further comprises:
   (e) attempting to correct the uncorrectable error using an error protection scheme.

15. The invention of claim 14, wherein the error protection scheme comprises error correcting code (ECC).

16. The invention of claim 14, wherein the error protection scheme is implemented in the write-once memory device.

17. The invention of claim 14, wherein the write-once memory device is coupled with a host device, and wherein the error protection scheme is implemented in the host device.

18. The invention of claim 13 further comprising:
   determining whether switching the single bit from the un-programmed state to the programmed state will create an uncorrectable error in a word resulting from the overwriting; and
   performing (d) only if switching the single bit from the un-programmed state to the programmed state will create an uncorrectable error.

19. The invention of claim 18 further comprising:
   if switching the single bit from the un-programmed state to the programmed state will not create the uncorrectable error in the word resulting from the overwriting:
       identifying at least one additional bit in the first plurality of data bits that is in the un-programmed state;
       generating an additional word comprising an additional plurality of data bits and an additional plurality of syndrome bits based on the additional plurality of data bits, wherein all of the additional plurality of data bits are in the unprogrammed state except for bits that correspond to the single bit and the at least one additional bit; and
       overwriting the first word with the additional word.

20. The invention of claim 13, wherein the word is associated with a digital file stored in the write-once memory device, and wherein (b)–(d) are performed in response to a command to delete the digital file.

21. The invention of claim 13, wherein the write-once memory device comprises a three-dimensional memory array.

* * * * *